US008319236B2

(12) United States Patent
Beanland et al.

(10) Patent No.: US 8,319,236 B2
(45) Date of Patent: Nov. 27, 2012

(54) LOW CREEP METALLIZATION FOR OPTOELECTRONIC APPLICATIONS

(75) Inventors: Richard Beanland, Northamptonshire (GB); Stephen Jones, Northamptonshire (GB); Ian Juland, Northamptonshire (GB)

(73) Assignee: Oclaro Technology Limited, Northamptonshire (GB)

( * ) Notice: Subject to any disclaimer, the term of this patent is extended or adjusted under 35 U.S.C. 154(b) by 472 days.

(21) Appl. No.: 12/028,055

(22) Filed: Feb. 8, 2008

(65) Prior Publication Data
US 2008/0198885 A1 Aug. 21, 2008

(30) Foreign Application Priority Data

Feb. 14, 2007 (GB) .................................. 0702787.3

(51) Int. Cl.
H01L 29/20 (2006.01)
(52) U.S. Cl. ............ 257/98; 257/99; 257/249; 257/449; 438/573
(58) Field of Classification Search .................... 257/98, 257/99, 249, 449, 448; 438/573
See application file for complete search history.

(56) References Cited

U.S. PATENT DOCUMENTS

| 4,471,005 | A |   | 9/1984  | Cheng et al. |
| 5,031,183 | A | * | 7/1991  | Waters ....................... 372/45.01 |
| 5,770,471 | A | * | 6/1998  | Nagai ............................. 438/31 |
| 5,990,500 | A | * | 11/1999 | Okazaki .......................... 257/99 |
| 6,057,565 | A | * | 5/2000  | Yoshida et al. ................ 257/102 |
| 6,169,297 | B1 | * | 1/2001 | Jang et al. ....................... 257/99 |
| 6,173,612 | B1 |   | 1/2001 | Golecki et al. |
| 6,242,761 | B1 | * | 6/2001 | Fujimoto et al. ................ 257/94 |
| 6,268,618 | B1 | * | 7/2001 | Miki et al. ....................... 257/99 |
| 6,285,697 | B1 | * | 9/2001 | Landwehr et al. ......... 372/45.01 |
| 6,329,716 | B1 | * | 12/2001 | Nido et al. ..................... 257/745 |
| 6,423,561 | B1 | * | 7/2002 | Chino et al. .................... 438/29 |
| 6,449,298 | B1 | * | 9/2002 | Chino et al. ............... 372/45.01 |
| 6,611,003 | B1 | * | 8/2003 | Hatakoshi et al. .............. 257/98 |
| 6,618,410 | B1 | * | 9/2003 | Fischer et al. ............. 372/45.01 |
| 6,654,534 | B1 | * | 11/2003 | Prosyk et al. .................. 385/131 |
| 6,734,468 | B2 | * | 5/2004 | Uemura et al. ................. 257/99 |
| 6,804,276 | B2 | * | 10/2004 | Gen-ei et al. ................... 372/36 |
| 6,861,340 | B2 | * | 3/2005 | Takeya ........................... 438/522 |
| 6,867,058 | B2 | * | 3/2005 | Uemura et al. ................. 438/46 |
| 6,894,391 | B1 | * | 5/2005 | Takatani ....................... 257/744 |
| 7,180,094 | B2 | * | 2/2007 | Seong et al. .................... 257/59 |
| 7,396,583 | B2 | * | 7/2008 | Yoshikai et al. .............. 428/323 |
| 7,508,077 | B2 | * | 3/2009 | Watanabe et al. ............. 257/763 |

(Continued)

FOREIGN PATENT DOCUMENTS

JP 2000-22277 1/2000

(Continued)

OTHER PUBLICATIONS

Great Britain Search Report for corresponding Application No. 0702787.3 dated May 10, 2007.

(Continued)

*Primary Examiner* — Eugene Lee
(74) *Attorney, Agent, or Firm* — Patterson & Sheridan, L.L.P.

(57) ABSTRACT

A metallization on a semiconductor substrate is disclosed in the form of a laminate comprising a plurality of layers of a "conducting" metallization for providing electrical conductivity, interspersed with a plurality of layers of another metallization. By providing many layers the thickness of each individual layer can be reduced. Reduction in thickness of each layer leads to a reduction in grain size and a consequent reduction in creep over the lifetime of a device.

26 Claims, 3 Drawing Sheets

U.S. PATENT DOCUMENTS

| | | | |
|---|---|---|---|
| 7,569,988 B2 * | 8/2009 | Ikeda et al. | 313/506 |
| 7,589,346 B2 * | 9/2009 | Biwa et al. | 257/13 |
| 7,872,274 B2 * | 1/2011 | Murai et al. | 257/99 |
| 2008/0108188 A1 * | 5/2008 | Jeong et al. | 438/172 |
| 2009/0212307 A1 * | 8/2009 | Baur et al. | 257/98 |

FOREIGN PATENT DOCUMENTS

| | | |
|---|---|---|
| JP | 2000-183401 | 6/2000 |

OTHER PUBLICATIONS

R. Rousina-Webb, Ian Betty, et al.; "The effect of process-induced stress in InP/InGaAsP weakly confined waveguides"; from Optoelectronic Interconnects VII: Photonics Packaging and Integration II, Proceedings of SPIE vol. 392 (2000).

Vig et al.; "The Aging of Bulk Acoustic Wave Resonators, Filters and Oscillators"; http://www.ieee-uffc.org/freqcontro/vigaging91/aging.htm.

Thornell et al.; "Internal stress in sputtered gold electrodes and its significance for quartz resonator"; 1999 Joint Meeting EFTF-IEEE IFCS, pp. 800-803.

Lewis et al.; "Creep deformation in multilayered and microlaminate materials"; JOM Jan. 2003, pp. 34-37.

Was et al.; "Deformation and fracture in microlaminates"; Thin Solid Films 286 (1996) pp. 1-31.

Kobrinsky & Thompson; "The thickness dependence of the flow stress of capped and uncapped polycrystalline Ag thin films"; J Applied Physics Letters, vol. 73, No. 17, pp. 2429-2431.

Official Action for corresponding Application No. GB0702787.3 dated Mar. 1, 2011.

* cited by examiner

LOW CREEP METALLIZATION FOR OPTOELECTRONIC APPLICATIONS

FIELD OF THE INVENTION

The present invention relates to low creep metallization on semiconductor substrates. In particular, the invention relates to metallization for optoelectronic applications.

BACKGROUND OF THE INVENTION

Electrodes in optoelectronic semiconductor waveguide devices are generally provided as metallizations. Current metallization schemes generally use simple structures. The principal component is gold, due to its high electrical and thermal conductivities, although further metal layers are usually located between the gold and the semiconductor to act as barriers to interdiffusion and excessive reaction of gold to the semiconductor.

For example, a typical metallization scheme for use with III-V semiconductors, such as InP, is Ti:Pt:Au (where X:Y:Z denotes successively deposited layers of materials X, Y and Z), each comprising a single layer of each metal. Each layer is polycrystalline, i.e. the metal forms into separate crystals.

FIG. 1 illustrates a such a typical prior art metallization 1 on an InP semiconductor substrate 2. An insulation layer 3 (e.g. silicon dioxide) and a metallization structure comprised of three metallization layers 4, 5 and 6 are formed on the substrate 2. The metallization layers serve different purposes and have different relative thicknesses:

A relatively thin titanium layer 4 provides a good adhesion to the semiconductor and blocks diffusion of indium out of the semiconductor.

A relatively thin intervening platinum layer 5 prevents diffusion of gold through the titanium and into the semiconductor, which would damage the semiconductor's performance.

A relatively thick gold layer 6 provides a low electrical resistance, a robust structure and a high rate of thermal dissipation. It is desirable that the gold layer should be sufficiently thick to provide a low electrical resistance for good current flow through the electrode, into the device beneath, and that it should also provide a high thermal conductivity for good thermal dissipation from the active regions of the device. In such prior art devices, the layer thickness is such that it is not the size limiting step, as far as the crystallographic size is concerned.

In such structures the titanium and platinum layers 4, 5 are typically a few tens of nm in thickness, whereas the gold layer 6 is generally up to several hundreds of nm thick. The layers are usually deposited either by evaporation or by sputtering. A further even thicker layer of electro-plated gold (not shown) may be formed on top of the gold layer 6. A further metallization (not shown) is typically also provided on the semiconductor substrate 2 as a secondary electrode, and may be on a surface opposite to the metallization structure.

The application of the metal layers to the semiconductor can cause stress in the semiconductor. For many applications this stress is generally relatively unimportant. However, in optical waveguides such stress can produce undesirable optical effects.

It is known that thick metallizations produce built-in stress, at the start-of-life (SOL) of the semiconductor, and efforts have been made to produce metal layer systems with low built-in SOL stress. For example, the paper "The effect of process-induced stress in InP/InGaAsP weakly confined waveguides", R. Rousina-Webb et al., from Optoelectronic Interconnects VII: Photonics Packaging and Integration II, Proceedings of SPIE Vol 3952 (2000), discusses broadening and mode splitting of the near-field optical output of a waveguide caused by built-in stress from a Ti:Pt:Au electrode provided on a waveguide ridge of an optoelectronic device, and goes on to disclose an approach to reduce this effect. The paper discloses that SOL stress is affected by the annealing stage of post-deposition processing, although the possible mechanisms causing this are not discussed. The proposed solution is the use of an additional metal layer (e.g. tungsten) to produce opposite stress to balance the innate tensile stress of the other layers (i.e. Ti, Pt and Au). However, in high performance devices such solutions are only suitable for devices that are operated at a single constant temperature, due to the effects of differential thermal expansion. Further such devices may be liable to irreversible changes due to plastic deformation of the electrode, as a result of exposure to extremes of temperature, even in storage.

Besides lateral mode guiding problems, stress in optoelectronic devices causes other undesirable effects such as uncontrolled refractive index change, which affects the optical path length of a waveguide. Three examples of problems produced by uncontrolled refractive index change in semiconductor optoelectronic devices are:

Refractive index change in a distributed Bragg reflector laser (DBR) changes the optical cavity length, changing the lasing wavelength and potentially inducing mode hopping.

Refractive index change in a distributed feedback laser (DFB), and also in the grating section of a DBR laser changes the effective pitch of the gratings and thus the selection of the lasing wavelength. Such a change will also potentially induce mode-hopping in DBR lasers.

Mach-Zehnder interferometer modulators (MZ) work by splitting a signal through two waveguide arms of controllable optical path length and recombining the signal to produce controlled optical interference. Refractive index changes affect the optical path length difference of the two arms, affecting the output power from the recombiner, with a deleterious effect on the extinction ratio (e.g. optical output power ratio of 1s and 0s in binary data modulation).

It is known that optoelectronic devices are temperature sensitive, and that temperature dependence of built-in stress is a contributory factor. To overcome the problems of temperature dependant stress, optoelectronic components are typically mounted on thermoelectric coolers (TEC, also known as Peltier coolers) that enable the chip to be maintained at a substantially constant temperature.

However, an additional problem has now been identified, which is that metallizations can change due to aging effects during a product lifetime. Metallizations are polycrystalline layers, and the crystal boundaries move over time, by a process known as creep. Gold, in particular, is very soft, and stresses in the material—produced during deposition or subsequent temperature cycling—relax over long periods of time. This can produce changes in built-in stress, typically by relaxation of stress, which changes the optical performance of the optoelectronic device. This creep induced problem is not overcome by the use of temperature stabilization, e.g. by a TEC. Furthermore the SOL stress optimisation discussed by Rousina-Webb et al. above does not fully overcome the problem of changes in stress caused by creep.

There is a need, therefore, for a metallization system which overcomes, or at least alleviates, these problems.

STATEMENT OF THE INVENTION

In accordance with one aspect of the present invention there is provided an assembly comprising a semiconductor substrate and an electrode deposited on the substrate, the electrode including a microlaminate comprising a plurality of layers of a first metallization for providing electrical conductivity, interspersed with a plurality of layers of a second metallization for providing mechanical strength.

The first metallization is preferably a material having high conductivity, such as gold.

Preferably each layer of the first metallization (and preferably also each layer of the second metallization) is less than or equal to 100 nm in thickness. Preferably a metallization may be less than or equal to 60 nm in thickness, and yet more preferably may be less than or equal to 30 nm in thickness. Preferably a metallization layer may be at least 1 nm in thickness, more preferably at least 5 nm in thickness, and yet more preferably at least 10 nm in thickness.

Thus a single thick layer of conductive metallization can be replaced by many thinner layers, forming a laminated metallization (the microlaminate). The overall electrical and thermal conductivity of the electrode is still high, but subject to less creep, since many thin layers may exhibit less creep than a single thick layer, in the case of materials that are susceptible to creep caused by defect movement when formed into thick layers. The microlaminate comprises different metallization layers, which may be of any suitable metallizations known to one skilled in the art, for example being chosen from metals (e.g. Au, Pt, Ti or W), metal carbides (e.g. TiC or TaC), metal nitrides (e.g. TiN or TaN) or metal borides (e.g. $TiB_2$). The semiconductor substrate may be InP.

In some laminated metallization schemes it may be necessary or advantageous to include layers of a third metallization, which may be interspersed between each successive layer of the first and second metallization, to prevent the first and second layers forming intermetallic compounds. If the first metallization is gold and the second metallization is titanium, the third metallization may preferably be platinum. Alternatively it may be possible to form a microlaminate using adjacent materials that form intermetallic compounds, if said intermetallic compounds are stable in standard operating conditions.

Preferably, each layer of first, second and/or third metallization is sufficiently thin that a creep mechanism within that layer caused by the movement of defects is substantially suppressed. The layers may be sufficiently thin that crystal size is constrained by the thickness of the layers. Thus each layer of first metallization preferably has a thickness less than or equal to the average lateral grain size of the first metallization (i.e. in a direction parallel to the plane of the layer). Each layer of first metallization is thus preferably predominantly of single crystal thickness.

The metallization layers of the microlaminate preferably form a repeating pattern of layer. The number of repeat periods within the microlaminate is at least two, preferably at least three, and yet more preferably at least five. This may result in a microlaminate with overall thickness of the order of 300 nm or more.

In accordance with another aspect of the present invention there is provided an assembly comprising a semiconductor substrate and an electrode formed on the substrate, the electrode including a microlaminate comprising a plurality of layers of at least two metallizations, at least one of the metallizations of the microlaminate formed of a material having a creep mechanism dominated by defect movement when formed in a thick layer, wherein the layers of that metallization are sufficiently thin to ensure that the stresses within the microlaminate do not vary appreciably over time at typical operating and storage temperatures (e.g. between −40° C. and +85° C., and preferably at room temperature). Preferably the other metallization layer or layers within the microlaminate are also sufficiently thin to ensure that the stresses within the microlaminate do not vary appreciably over time. The or each metallization layer is preferably thin enough to substantially suppress creep caused by defect movement.

The semiconductor substrate is preferably a waveguide. The invention also provides an optoelectronic device comprising an assembly as described above, such as a ridge laser, electro-optic modulator, semiconductor optical amplifiers (SOA), or a photodetector.

In accordance with another aspect of the present invention there is provided a method of manufacturing a device, comprising depositing an electrode on a semiconductor substrate, the electrode including a microlaminate comprising a plurality of layers of a first metallization, interspersed with a plurality of layers of a second metallization.

BRIEF DESCRIPTION OF THE DRAWINGS

Some preferred embodiments of the invention will now be described by way of example only and with reference to the accompanying drawings, in which.

DETAILED DESCRIPTION OF THE PREFERRED EMBODIMENT

Figure 2:
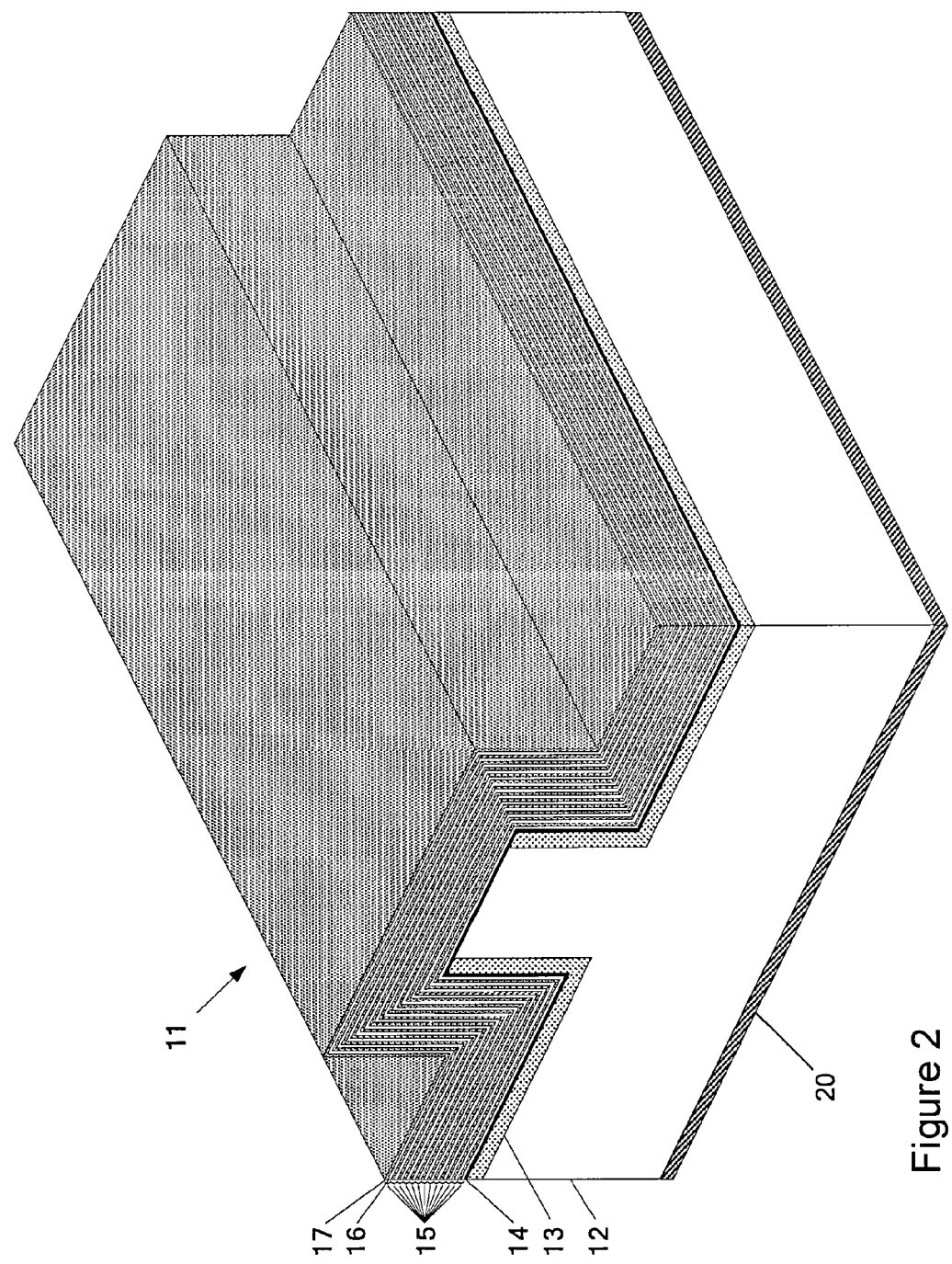
FIG. 2 is a schematic representation of a laminated metallization structure on a waveguide.

FIG. 2 is a schematic representation of a metallization structure 11 on a semiconductor substrate 12, with an insulation layer 13. The metallization scheme comprises a titanium adhesion promoting layer 14 and a microlaminate 15. The microlaminate 15 comprises many thin layers of platinum 16 and gold 17. The titanium adhesion promoting layer 14 is deposited on the substrate 12, followed by a platinum layer 16 and a gold layer 17. A further platinum layer is deposited on the gold layer, and a further gold layer is deposited on the further platinum layer, with the sequence then repeated, so that the microlaminate consists of a series of layers Pt:Au:Pt:Au:Pt:Au . . . . A further metallization 20 is typically provided on the semiconductor substrate 12, for example on the opposite surface from the metallization structure 11.

The top metallization layer of the microlaminate may be gold, to which gold wires may easily be bonded. The top metallization layer may be an alternative material that bonds well to gold wires. The upper surface of the metallization structure may be covered with a layer of dielectric, which may be selectively removed in regions to which gold bonds or electroplated gold are applied.

Figure 1:
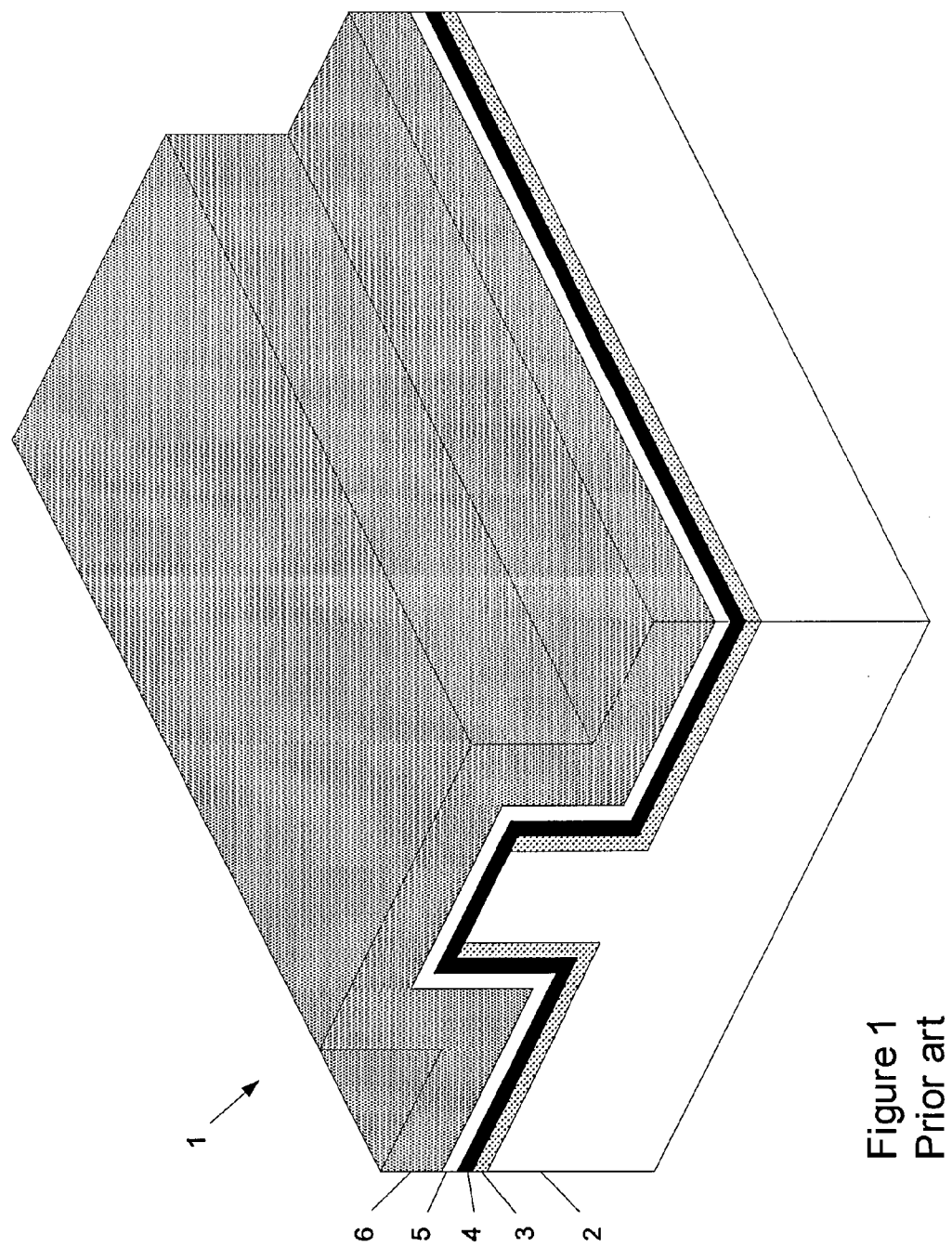
FIG. 1 is a schematic representation of a known metallization on a waveguide.

Each layer of the microlaminate is very thin (generally in the range of 10-100 nm), and the total thickness of the microlaminate may be similar to the thickness of the simple metallization structure shown in FIG. 1 (i.e. of the order of several hundreds of nanometres), such that it provides approximately similar electrical and thermal conductivity.

It will be appreciated that the repeating Pt:Au: . . . pattern described provides one example of a microlaminate, and that other combinations of materials may also be appropriate. Any combination of materials which provides the appropriate electrical or other required properties may be used, although it will be appreciated that adjacent layers of materials that react to form intermetallic compounds (e.g. Au and Ti) may not be suitable, since any thermal processing will tend to produce intermetallic layers which may significantly change the stress in the film. However, materials that react to produce intermetallic layers may be used if the reaction proceeds to completion and the final structure is stable under normal device operation. The important feature is that the microlaminate is a composite material in which any significant movements of defects in a metallization is reduced, relative to a thick layer, by a reduction in grain size, achieved in turn by restricting the layer thickness. A reduction of the movement of defects leads to a consequent reduction in creep of the metallization over the lifetime of a device.

Figure 3:
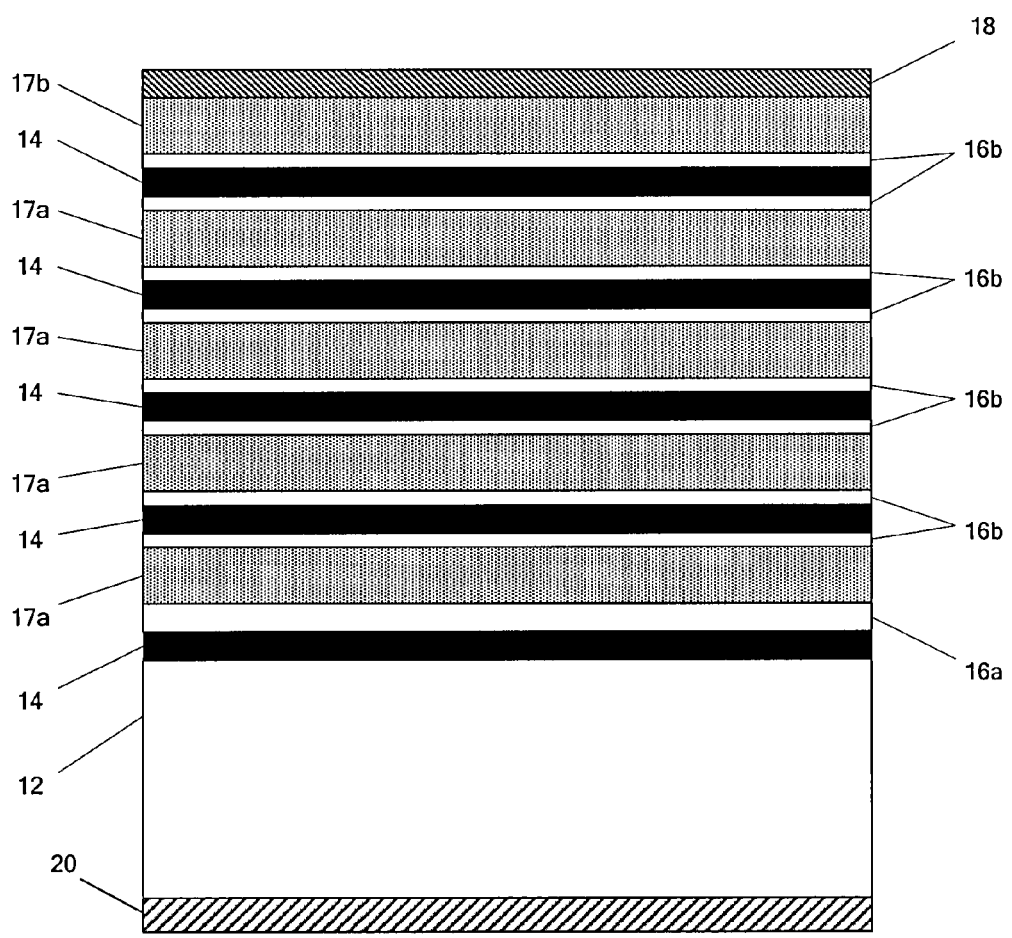
FIG. 3 is a schematic representation of a further laminated metallization structure.

FIG. 3 is schematic representation of a metallization structure comprising three different metals Ti 14, Pt 16a and 16b, and Au 17a and 17b. In this metallization structure Pt layers 16a and 16b are interspersed between the layers of Au 17a and 17b and Ti 14 to prevent the Au and Ti from forming inter-metallic compounds. The layer of Pt 16a closest to the semiconductor substrate 12 is thicker than the other Pt layers 16b elsewhere in the metallization structure, to provide an enhanced barrier to the diffusion of gold into the semiconductor substrate 12. A dielectric 18 is provided on the final layer gold 17b.

In operation, the multi-layer material has significantly enhanced physical properties. In particular, the creep is less than the previously known metallization structures comprising relatively thick layers. Material strength (resistance to plastic deformation) is inversely related to grain size (known as the Hall-Petch relationship). If the layers are sufficiently thin, then the grain size is typically limited by the film thickness. By depositing many thin layers instead of one thick layer the grain size is reduced, as is the susceptibility to creep that is caused by the movement of defects.

It is believed that, for polycrystalline material with very small grain sizes at typical operating and storage temperatures of optoelectronic devices (e.g. between −40° C. and +85° C., and preferably at room temperature), the mechanism for creep which is generally dominant involves the movement of defects within the material. The reduction in grain size leads to a reduction in such defect-dominated creep, since the total thermodynamic force per unit area on a defect between adjacent grains is roughly proportional to the size of the grains.

A second mechanism for creep is the diffusion of atoms in the material, which principally occurs at the free surface of the material and along the grain boundaries in the material. This is usually the dominant mechanism at high temperatures (e.g. during annealing). In some materials such diffusion-driven creep can lead to an increase in creep with a reduction in grain size. However, it is believed that, at room temperature, using the materials useful for optoelectronic metallizations, the exceptionally small grain size of the described multilayer structure attenuates this process by preventing diffusion of atoms across the layers of different material.

Thus the microlaminate described is generally stable against creep at typical operating and storage conditions over the life of a device. However, it will be appreciated that it is still desirable to ensure that the SOL, or "built-in" stress is also low, for example by including in the microlaminate metallization layers of tungsten.

The grain size of a deposited layer depends on several parameters, including the nature of the substrate (density of nucleation sites), the time given to deposited material to find its place before it is buried by still more material, and how the material behaves in the layer.

In the present case there are many nucleation sites in the initial phase of deposition, resulting in a very small grain size (typically <10 nm) at the bottom of the first layer. Some grains are more favourable for the next layer of deposition than others, and the deposition rate is slow enough for each subsequent atomic layer to have a bigger fraction of these grains. The lateral grain size therefore increases with distance from the first interface. This is not 'grain growth' since the grain boundaries do not move.

Eventually a point is reached where this process no longer functions because the re-arrangement of one layer of atoms on the surface is suppressed by the arrival of more material; the lateral grain size is then limited by the deposition rate. In metallization films in electrodes the maximum lateral grain size is typically about 50 nm, although each large grain runs through the entire film thickness. This can be significantly varied by varying the deposition temperature (which changes the atomic mobility) and deposition rate: high deposition rates and low temperatures give small grain sizes, whereas low deposition rates and high temperatures give large grain sizes. Large grain sizes also occur if there are not many initial nucleation sites.

Subsequent thermal processing at temperatures high enough to allow diffusion in the bulk will change this. Grain growth will occur, with lower energy grains growing at the expense of higher energy ones. If the temperature and time are large enough the grains will tend to become equiaxed, with similar lateral and vertical dimensions. A microlaminate having many thin layers has a significant effect in this situation, since the grains become equiaxed in each thin layer rather than the total microlaminate thickness.

Thus, in order to suppress grain growth during thermal processing, it is preferable that each layer thickness is less than or equal to the average lateral grain size.

This invention has applications in any structure where the stress inherent in the metallization has an effect on the operating parameters of the device. These include, but are not limited to semiconductor devices including ridge lasers, electro-optic modulators optical amplifiers, and photodetectors.

It will be appreciated that variations from the above described embodiments may still fall within the scope of the invention. For example, FIG. 2 illustrates a microlaminate formed by a repeating pattern of platinum and gold layers, with a titanium layer to promote adhesion to the semiconductor substrate, based upon the Ti:Pt:Au metallization scheme of FIG. 1. Such metallization schemes are generally used for p-type InP contacts. Cr:Pt:Au, Ni:Ge:Au and Ti:Ni:Au metallization schemes are generally used with n-type InP, p-type GaAs and GaN respectively, and the scope of the present invention includes metallization schemes that include microlaminates, based upon these materials. Furthermore, the schemes described above involving three metallizations are generally described as having a structures of the form "ABCBABCBABC . . . ". It will be appreciated that, for some materials, structures of the form "ABCABCABC . . . " may also be suitable. For example such a structure may be suitable if A=Ti, B=Pt and C=Au.

The invention claimed is:

1. An assembly comprising a semiconductor substrate and an electrode deposited on the substrate, the electrode including a microlaminate comprising a repeating pattern of layers, wherein each repetition includes the same order of combination of layers of a first metallization, a second metallization and a third metallization,
   wherein the first metallization is a material having high electrical conductivity, and each layer of first metallization is sufficiently thin that a creep mechanism within that layer caused by movement of defects is substantially suppressed, and wherein the layers of metallization are formed so that the structure forms a pattern of the form "ABCBAB-CBABCB . . ." where A corresponds to a layer of first metallization, B corresponds to a layer of second metallization, and C corresponds to a layer of third metallization.

2. The assembly of claim 1, wherein each layer of first metallization is sufficiently thin that crystal size is constrained by the thickness of the layer.

3. The assembly of claim 1, wherein each layer of first metallization is predominantly of single crystal thickness.

4. The assembly of claim 1, wherein each layer of first metallization has a thickness less than or equal to the average lateral grain size of the first metallization.

5. The assembly of claim 1, wherein each layer of the first metallization is less than or equal to 100 nm in thickness.

6. The assembly of claim 1, wherein each layer of the first metallization is less than or equal to 30 nm in thickness.

7. The assembly of claim 1, wherein the first metallization is gold.

8. The assembly of claim 1, wherein the layers of second metallization are interspersed between each layer of first metallization and each layer of third metallization to prevent the first and third layers from forming intermetallic compounds.

9. The assembly of claim 8, wherein the third metallization is titanium.

10. The assembly of claim 9, wherein the second metallization is platinum.

11. The assembly of claim 1, wherein the second metallization is platinum.

12. The assembly of claim 1, wherein the metallization layers form a repeating pattern through the width of the microlaminate.

13. The assembly of claim 12, wherein the number of repeats of the repeating pattern in the microlaminate is at least three.

14. The assembly of claim 13, wherein the number of repeats of the repeating pattern in the microlaminate is at least five.

15. The assembly of claim 1, further comprising an adhesion promoting layer between the microlaminate and the substrate.

16. The assembly of claim 1, further comprising an insulation layer on the semiconductor substrate.

17. The assembly of claim 1, further comprising an additional metallization on the opposite side of the substrate from the electrode.

18. The assembly of claim 1, wherein the substrate is InP.

19. The assembly of claim 1, wherein the semiconductor is an optical waveguide.

20. An optoelectronic semiconductor waveguide device comprising the assembly of claim 1.

21. A semiconductor laser comprising the assembly of claim 1.

22. A method of manufacturing a device, comprising forming an electrode on a semiconductor substrate, the electrode including a microlaminate comprising a repeating pattern of layers, wherein each repetition includes the same order of combination of layers of a first metallization, a second metallization and a third metallization, wherein the first metallization is a material having high electrical conductivity, and each layer of first metallization is sufficiently thin that a creep mechanism within that layer caused by the movement of defects is substantially suppressed, and wherein the layers of metallization are formed so that the structure forms a pattern of the form "ABCBAB-CBABCB . . ." where A corresponds to a layer of first metallization, B corresponds to a layer of second metallization, and C corresponds to a layer of third metallization.

23. The method of claim 22, wherein each layer of first metallization is sufficiently thin that crystal size is constrained by the thickness of the layer.

24. The method of claim 22, wherein each layer of first metallization has a thickness less than or equal to the average lateral grain size of the first metallization.

25. The method of claim 22, wherein the layers of second metallization are interspersed between each layer of first metallization and each layer of third metallization to prevent the first and third layers from forming intermetallic compounds.

26. The method of claim 22, wherein each layer is at most 100 nm in thickness.

* * * * *